United States Patent
Yuan et al.

(10) Patent No.: US 7,246,339 B2
(45) Date of Patent: Jul. 17, 2007

(54) METHODS FOR CREATING AND EXPANDING LIBRARIES OF STRUCTURED ASIC LOGIC AND OTHER FUNCTIONS

(75) Inventors: Jinyong Yuan, Cupertino, CA (US); Kar Keng Chua, Penang (MY); Ji Park, San Jose, CA (US)

(73) Assignee: Altera Corporation, San Jose, CA (US)

( * ) Notice: Subject to any disclaimer, the term of this patent is extended or adjusted under 35 U.S.C. 154(b) by 46 days.

(21) Appl. No.: 11/101,949

(22) Filed: Apr. 8, 2005

(65) Prior Publication Data

US 2006/0230376 A1    Oct. 12, 2006

(51) Int. Cl.
G06F 17/50 (2006.01)
H03K 17/693 (2006.01)
(52) U.S. Cl. ...................................... 716/16
(58) Field of Classification Search ............... 716/4, 716/16
See application file for complete search history.

(56) References Cited

U.S. PATENT DOCUMENTS

| | | | |
|---|---|---|---|
| 5,815,405 A * | 9/1998 | Baxter ............................ 716/3 |
| 5,825,202 A | 10/1998 | Tavana et al. |
| 5,874,834 A | 2/1999 | New |
| 6,091,262 A | 7/2000 | New |
| 6,094,065 A | 7/2000 | Tavana et al. |
| 6,242,945 B1 | 6/2001 | New |
| 6,490,707 B1 | 12/2002 | Baxter |
| 6,515,509 B1 | 2/2003 | Baxter |
| 6,526,563 B1 | 2/2003 | Baxter |
| 2003/0149953 A1 * | 8/2003 | Whitaker et al. ............. 716/17 |
| 2004/0111691 A1 | 6/2004 | Tan et al. |
| 2004/0261052 A1 | 12/2004 | Perry et al. |
| 2005/0071787 A1 * | 3/2005 | Koga et al. .................... 716/1 |
| 2005/0121789 A1 * | 6/2005 | Madurawe .................. 257/758 |
| 2005/0146352 A1 * | 7/2005 | Madurawe .................... 326/41 |

OTHER PUBLICATIONS

"LCELL WYSIWYG Description for the Stratix II Family", Version 1.1, Altera Corporation, Mar. 22, 2004.

* cited by examiner

*Primary Examiner*—Paul Dinh
*Assistant Examiner*—Suresh Memula
(74) *Attorney, Agent, or Firm*—Fish & Neave IP Group Ropes & Gray LLP; Robert R. Jackson (57) ABSTRACT

Structured ASICs that are equivalent to FPGA logic designs are produced by making use of a library of known structured ASIC equivalents to FPGA logic functions. Such a library is expanded by a process that searches new FPGA logic designs for logic functions that either do not already have structured ASIC equivalents in the library or for which possibly improved structured ASIC equivalents can now be devised. The new and/or improved structured ASIC equivalents are added to the library, preferably with version information in the case of FPGA logic functions for which more than one structured ASIC equivalent is known.

14 Claims, 11 Drawing Sheets

MODULE CHLE_6_3_ FEEEFAAAFCCCF000_0 (A,B,C,D,E,F, OUT)

input A;
...
output OUT;

wire M1;
...
wire I11;

MUX21 M0_i (.D0(M1), .D1(N10), .SEL(A), .OUT(OUT));
MUX21 M1_i (.D0(M2), .D1(N20), .SEL(B), .OUT(M1));
MUX21 M2_i (.D0(1'b0), .D1(D), .SEL(C), .OUT (M2));
NAND N20_i (.A(I20), .B(I21), .OUT(N20));
INV I20_i (.A(E), .OUT(I20));
INV I21_i (.A(M2), .OUT(I21));
NAND N10_i (.A(I10), .B(I11), .OUT (N10));
INV I10_i (.A(F), .OUT(I10));
INV I11_i (.A(M1), .OUT(I11));

// CHLE SIGNATURE:
// (M0 M1 N10 A)(M1 M2 N20 B)(M2 S0 D C)(N20 I20 I21)(I20 E)(I21 M2)(N10 I10 I11)(I10 F)(I11 M1)

endmodule

FIG. 5

METHODS FOR CREATING AND EXPANDING LIBRARIES OF STRUCTURED ASIC LOGIC AND OTHER FUNCTIONS

BACKGROUND OF THE INVENTION

This invention relates to application-specific integrated circuits ("ASICs"), and more particularly to the type of ASICs that are sometimes known as structured ASICs.

So-called structured ASICs are sometimes used as alternatives to programmable logic devices ("PLDs") such as field-programmable gate arrays ("FPGAs"). An FPGA has a generic structure that may include many identical blocks of logic circuitry, many registers, and a number of other types of circuit blocks such as RAM blocks, DSP blocks, PLL/DLL blocks, etc. These various circuitries are programmable to perform any of a variety of tasks. An FPGA also has a generic interconnection structure. This structure is programmable to interconnect the other circuitries on the device in any of many different ways. The logic blocks of such an FPGA may be referred to as logic elements, logic modules, adaptive logic elements, or adaptive logic modules ("LEs", "LMs", "ALEs", or "ALMs").

A known type of structured ASIC equivalent to an FPGA has a generic structure that includes many identical instances of a relatively simple circuit block (a so-called hybrid logic element or "HLE"). The structured ASIC may also generically include other blocks that are comparable to the special-purpose blocks on a related FPGA (e.g., RAM blocks, DSP blocks, PLL/DLL blocks, etc.). These generic attributes of the structured ASIC are embodied in several of the masks used to make the ASIC. These masks can therefore be the same or substantially the same for all ASICs of this general kind, and they give the ASIC its "structure." Other masks (but only some of the total mask set) are customized to give the structured ASIC particular functionality that is equivalent to the functionality of a related, programmed FPGA. For example, these customized masks may configure an HLE or a small group or cluster of HLEs (a complex HLE or "CHLE") to perform functions equivalent to those performed by an ALE in the related programmed FPGA. Similarly, the customized masks may configure a CHLE to perform functions equivalent to a register in the related programmed FPGA. The customized masks may also provide interconnections between HLEs, CHLEs, and/or other circuit blocks on the ASIC. These interconnections will typically include interconnections equivalent to those provided by the programmable interconnection resources of the related programmed FPGA.

Using a structured ASIC of this kind and in this way has a number of advantages. For example, only some of the ASIC masks need to be customized. This tends to reduce ASIC cost and to speed up the ASIC design/production cycle. It also reduces the risk of a design flaw in the ASIC, and it facilitates producing an ASIC that is a close operational equivalent to the related programmed FPGA (e.g., pin-for-pin identity, timing identity or near identity, etc.). Another advantage of this approach is that it tends to allow the ASIC to include less circuitry (including less circuitry for normal operations) than the related FPGA. This is so because only as many ASIC HLEs as necessary are devoted to performing the functions of each FPGA ALE, and in almost all FPGAs many ALEs are less than fully utilized.

Efficient and reliable conversion from FPGA designs to structured ASIC designs (and vice versa) is facilitated by using known ("library") conversions from FPGA circuit block functions to ASIC HLE/CHLE functions. This is especially true for FPGA ALE to ASIC HLE/CHLE conversions. The typical FPGA ALE is programmable to perform any of an enormous number of functions. It would therefore be desirable to accumulate in a library solutions that have been worked out for converting as many such FPGA ALE functions as it is reasonably possible to accumulate. Inclusion of an FPGA ALE function conversion in the library avoids the possible need, in the future, to implement that function in a possibly inefficient way, such as by having to break it down for implementation using several HLEs and/or CHLEs that must be interconnected using the "more expensive" global interconnection resources of the ASIC. This would be less efficient than being able to implement the function in one CHLE, for example, in which the HLEs can all be interconnected using "less expensive" local interconnection resources of the ASIC.

SUMMARY OF THE INVENTION

A method for adding to a library of structured ASIC equivalents of logic functions in accordance with this invention includes comparing a characteristic of a possibly new logic function to a similar characteristic of logic functions that are already in the library. The method further includes designing a structured ASIC equivalent of the possibly new logic function, and abstracting from that design a signature value that is descriptive of the design. If the characteristic comparison indicates that there is no logic function already in the library that has a characteristic comparable to the characteristic of the possibly new logic function, then the structured ASIC equivalent of the possibly new logic function (and its signature value) are added to the library. On the other hand, if the characteristic comparison found one or more instances of the same logic function characteristic already in the library, then the structured ASIC equivalent of the possibly new logic function (and its signature value) are added to the library only if one or more additional tests are satisfied. For example, one such test may require the ASIC equivalent of the possibly new logic function to employ no more instances of some structured ASIC circuitry than the structured ASIC equivalents associated with any other instances of the same logic function characteristic already in the library.

Further features of the invention, its nature and various advantages, will be more apparent from the accompanying drawings and the following detailed description.

DETAILED DESCRIPTION

Figure 2:
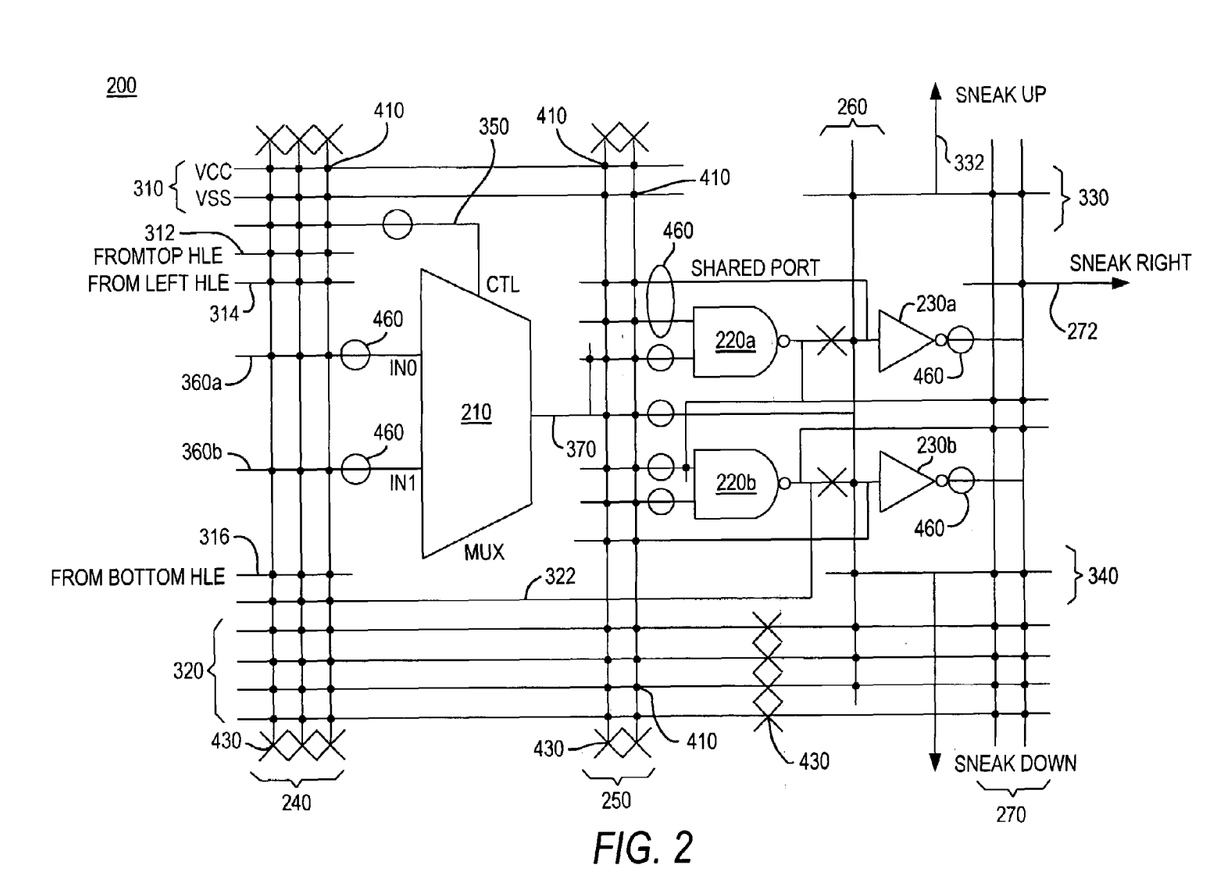
FIG. 2 is a simplified schematic block diagram of an illustrative basic unit of structured ASIC circuitry that is useful in explaining certain aspects of the invention.
Figure 3:
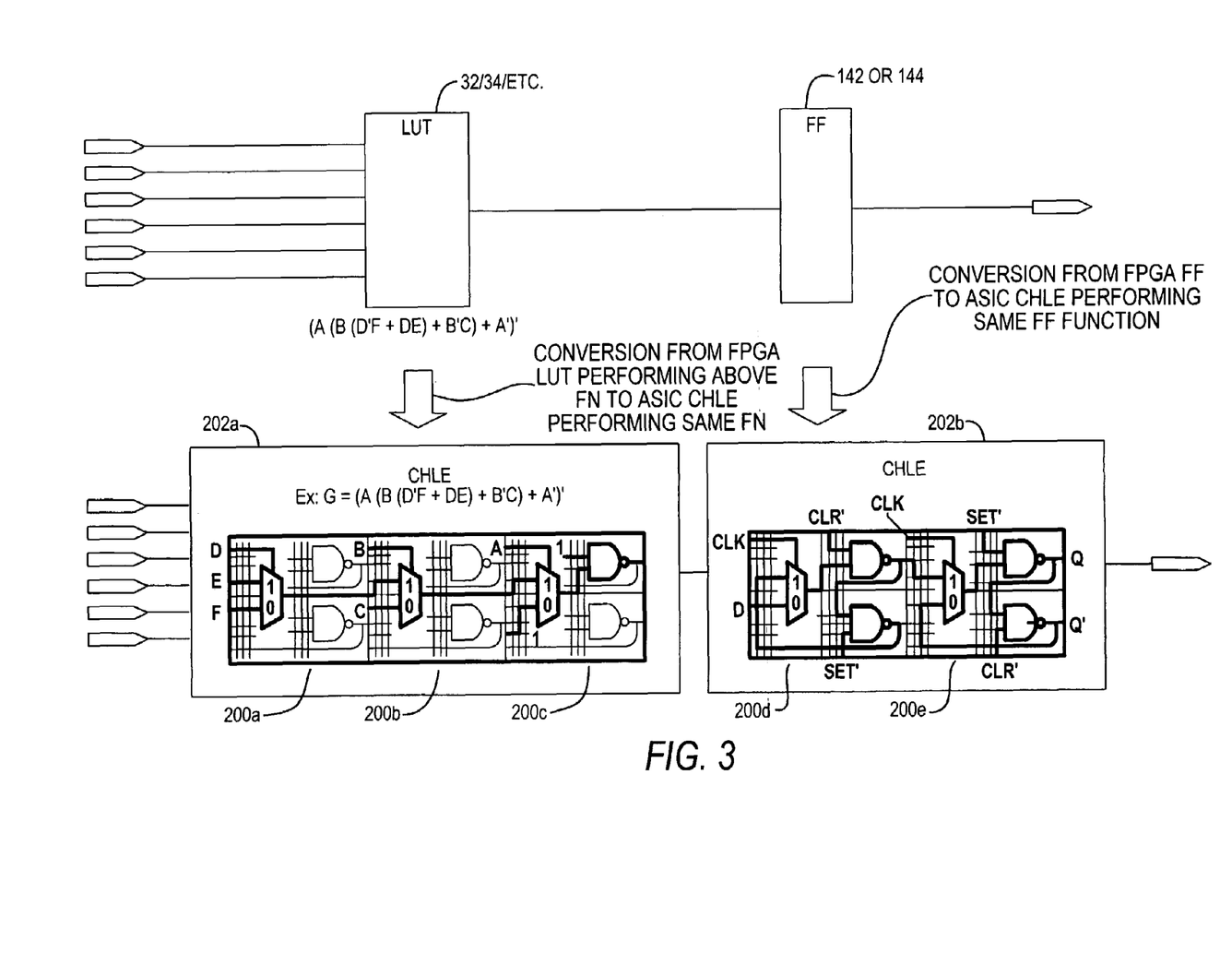
FIG. 3 is a simplified schematic block diagram showing equivalent implementations of certain illustrative circuit functions in FPGA and structured ASIC circuitry.

This specification illustrates the invention in the context of converting logic designs from a particular type of FPGA to a particular type of structured ASIC. These types of FPGAs and structured ASICs are explained in more detail in such references as Chua et al. U.S. patent application Ser. No. 10/884,460, filed Jul. 2, 2004, and Schleicher et al. U.S. patent application Ser. No. 11/050,607, filed Feb. 3, 2005, which are hereby incorporated by reference herein in their entireties. To facilitate understanding of the present invention without the need for reference to any other document, however, the next several paragraphs and related FIGS. 1-3 are reproduced (with only minor modifications) from the above-mentioned Schleicher et al. reference.

Figure 1:
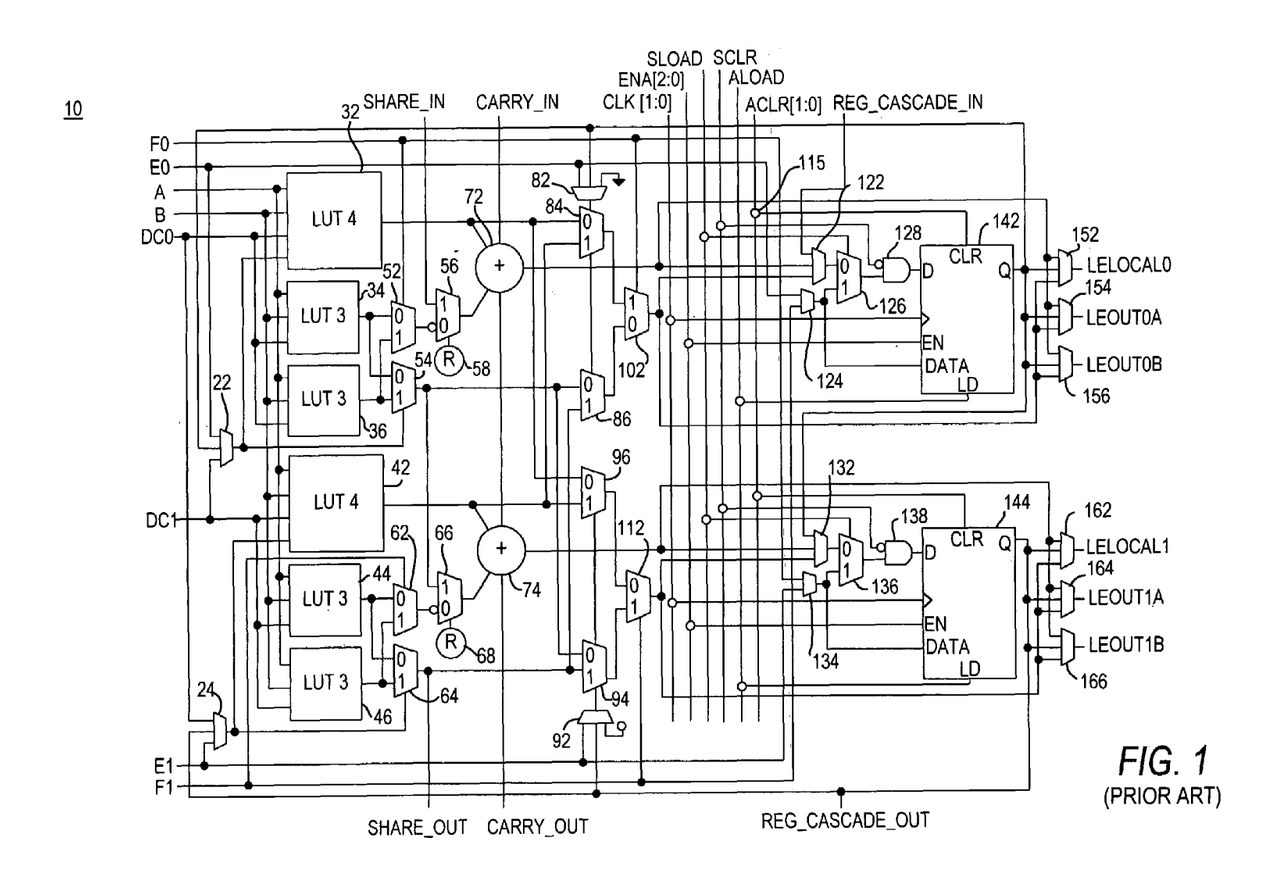
FIG. 1 is a simplified schematic block diagram of an illustrative basic unit of FPGA circuitry that is known to those skilled in the art.

An illustrative example of a basic logic circuit building block or unit 10 for inclusion in an FPGA is shown in FIG. 1. This FPGA building block circuitry (also sometimes referred to as an adaptive logic element ("ALE") or an adaptive logic module ("ALM")) is known to those skilled in the art and can therefore be described in a somewhat abbreviated way herein. ALE 10 includes multiplexers 22, 24, 52, 54, 56, 62, 64, 66, 82, 84, 86, 92, 94, 96, 102, 112, 122, 124, 126, 132, 134, 136, 152, 154, 156, 162, 164, and 166. Most of these multiplexers are programmably controlled by programmable random access memory ("RAM") bits that are generally not shown in the drawings (although RAM bits 58 and 68 in FIG. 1 are illustrative). Some of these multiplexers are more dynamically controlled by signals that can change during normal operation of the device. Multiplexer 112 is an example of this latter type of multiplexer. It is controlled by input F1 to ALE 10.

ALE 10 also includes look-up tables ("LUTs") 32, 34, 36, 42, 44, and 46. LUTs 32 and 42 are four-input look-up tables. The other LUTs are three-input look-up tables. Each of these LUTs is programmable to provide an output signal that is any logical combination of the input signals to that LUT.

Other components of ALE 10 are full adders 72 and 74, AND gates 128 and 138, and flip-flops 142 and 144. The conductor interconnections shown by open circles (e.g., connection 115) are programmable interconnections, which means that the interconnection may or may not be made, as desired by the user.

The LUT resources of ALE 10 are sufficient to enable the ALE to form any logical combination of up to six inputs to the ALE. Alternatively, if two somewhat smaller functions have some inputs in common, then the LUT resources of ALE 10 may be sufficient to perform two such functions. For example, it may be possible for an ALE 10 to form two five-input combinations, two four-input combinations, etc.

Full adders 72 and 74 enhance the arithmetic capabilities of ALE 10. For example, these components give ALE 10 the ability to perform two adjacent places of the binary addition of two numbers, including the handling of carry in and carry out signals.

Registers 142 and 144 (and associated circuitry) allow signals in ALE 10 to be either registered (by a register) or unregistered (bypassing a register). An ALE 10 register does not have to be used to register a signal originating in the ALE. A register can instead be used (in so-called lonely register mode) to register an input signal to the ALE. Other circuitry of the ALE can be used for other purposes while one or both of registers 142 and 144 are used in lonely register mode. Registers 142 and 144 are also capable of operating in different asynchronous or synchronous modes. "D" is the normal data input to each register; "DATA" is the asynchronous load data.

FIG. 2 shows an example of a basic logic circuit building block or unit 200 for inclusion in a structured ASIC. FIG. 2 herein is the same as FIG. 3 in the above-mentioned Chua et al. reference. Accordingly, the description of FIG. 2 can be somewhat abbreviated herein. Building block 200 may also be referred to as a hybrid logic element or HLE.

HLE 200 includes two-input multiplexer 210, NAND gates 220a and 220b, and inverters 230a and 230b. HLE 200 also includes some interconnection resources, some of which are mask programmable. For example, Xs identify locations at which conductor segments can be connected to one another or not, as desired, by appropriately customizing a mask (or masks) used to make the ASIC. Similarly, Os identify locations at which connections can be made, if desired, to one or more circuit layers (not shown) in which relatively long-distance interconnection conductors can be provided. Again, these connections and interconnections are made by appropriately customizing one or more of the masks used to make the ASIC. The solid dots at conductor intersections in FIG. 2 are also connections that can be made or not made, as desired, between the intersecting conductors. Once again, these connections are made, if desired, by appropriately customizing one or more of the masks used to make the ASIC.

It will be apparent that the logic capabilities of HLE 200 are much less than the logic capabilities of ALE 10 (FIG. 1). However, a relatively small number of adjacent or nearby HLEs can generally be put together to perform any function (s) that an ALE is performing in a user's logic design that has been implemented in an FPGA. FIG. 3, for example, shows the equivalence between three HLEs 200a, b, and c and the LUT circuitry 32/34/ETC. of an ALE 10 performing a particular six-input logical combination. FIG. 3 also shows the equivalence between two more HLEs 200d and e and flip-flop circuitry 142 or 144 of an ALE 10 (which can be the same ALE as is performing the six-input logical combination shown in FIG. 3). It should be understood that HLEs 200a-e are shown greatly simplified in FIG. 3. For the most part only the HLE circuit elements and connections that are actually in use are shown in FIG. 3. All the other HLE circuitry that is shown in FIG. 2 is actually present in each HLE 200a-e, but some of this detail is omitted from the FIG. 3 depiction (or shown using lighter lines) to simplify FIG. 3. Multiple HLEs 200 that are used together (e.g., to perform combinational logic equivalent to what can be performed in LUT circuitry of an ALE, or to perform a register function equivalent to what can be performed in flip-flop circuitry of an ALE) may be referred to as a cluster of HLEs, a complex HLE, or a CHLE. FIG. 3 therefore shows two CHLEs 202a and 202b.

The present invention relates to the desirability of having a library of known solutions to the problem of converting logic functions that may be implemented in a user's FPGA logic design to structured ASIC equivalents of those logic functions. In the particular illustrative context shown and described herein, the invention especially relates to building a library of known conversions from LUT-based FPGA combinational logic functions to HLE-based structured ASIC designs and implementations for those same logic functions. This illustrative embodiment of the invention will now be described in detail.

Figure 4A:
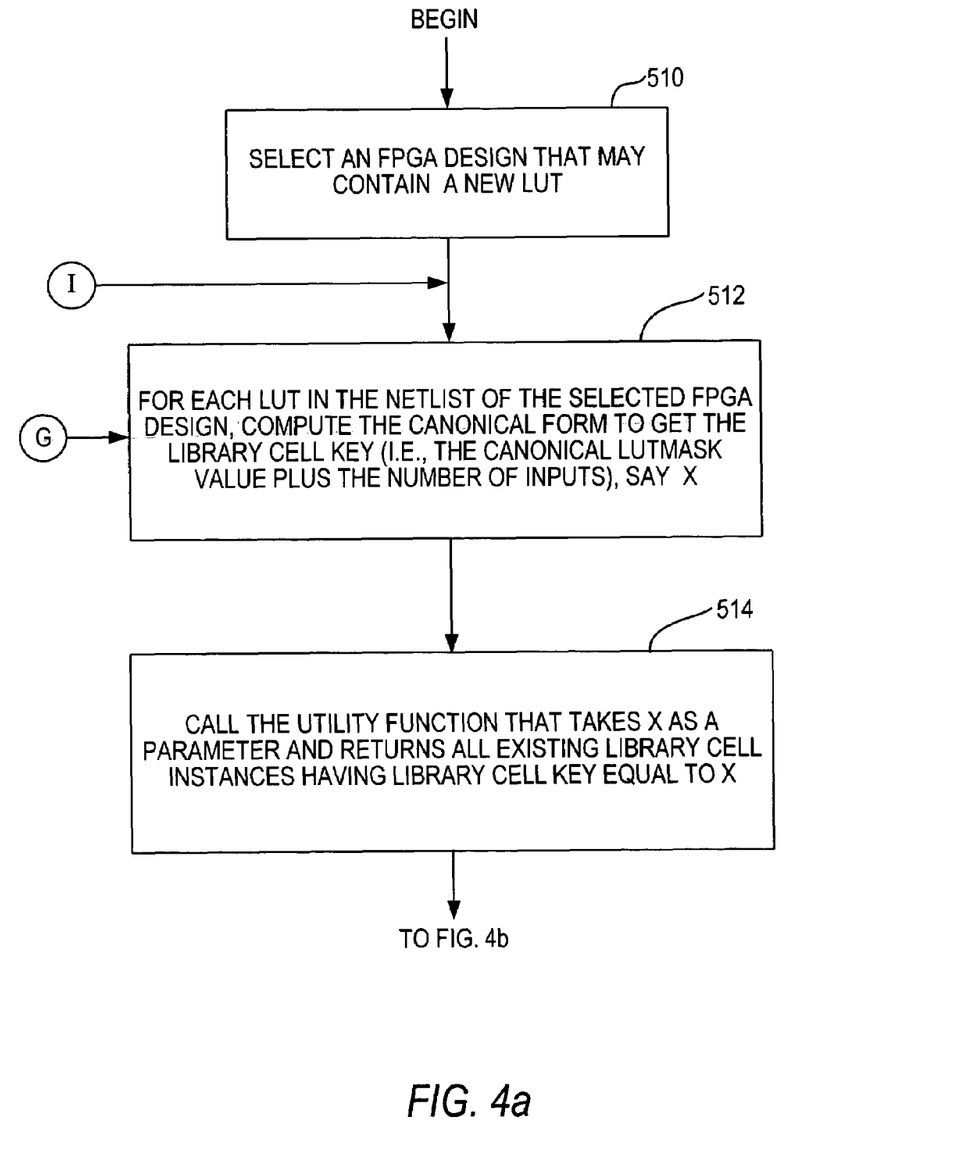
FIGS. 4*a*-4*g* collectively comprise a simplified flow chart of an illustrative embodiment of the invention.

The process of adding functions to a library of functions for which there are known structured ASIC CHLE equivalents to programmed FPGA ALEs begins with step 510. In this step an FPGA design that may contain one or more new uses of a LUT is selected.

In step 512, for each LUT in the design selected in step 510 the canonical form of the logic performed by that LUT is determined. The canonical form is a standardized form. Any form of a given logical function that a LUT may be programmed to perform is converted to the canonical (i.e., common or standard) form of that function by step 512. Once the canonical form of the logic function has been determined, step 512 further determines a library cell key value for that logic function. In this embodiment the library cell key value is the value of the data stored in the RAM cells in a LUT programmed to perform the canonical form of the logic function, plus the number of inputs to the logic function. In the particular example being discussed, an ALE has 64 programmable RAM cells in its LUT circuitry. The term "lutmask" is sometimes used for the values of these 64 bits. Sixty-four binary (RAM cell) values can be represented by 16 hexadecimal digits. Accordingly, the library cell key may be thought of as these 16 hexadecimal digits plus the number of inputs to the ALE. For convenience herein, any particular value of the library cell key in step 512 is referred to as X.

In step 514 the library of cells for which CHLE equivalents have been previously developed is accessed using the library cell key value X from step 512. Step 514 returns all existing library cell instances (if any) having library cell key equal to X.

Step 520 tests whether the performance of step 514 has produced any results. If step 514 did not find any existing library cells having key value equal to X, then step 520 causes control to pass to step 522. If step 514 finds one or more existing library cells having key value equal to X, then step 520 causes control to pass to step 540. The branch from step 520 to step 522 will be considered first.

In step 522 the LUT under consideration (for which no existing library cell was found in step 514) is operated on by binary decision diagram ("BDD") mapper software and NAND MUX packing software. These types of operations are described in more detail in Yuan et al. U.S. patent application Ser. No. 10/916,305, filed Aug. 11, 2004 (Docket No. 174/341 (A1682)), which is hereby incorporated by reference herein in its entirety. Briefly, the BDD mapper software renders the logic of the LUT as a binary decision tree (or diagram), and then permutes the inputs to that tree or diagram until a logically equivalent diagram with the minimum number of nodes is found. This will be the form of the LUT that can be implemented in a CHLE having the smallest number of HLEs. Then as a further step, functions in these HLEs are examined to determine whether any functions in downstream HLEs can be packed into unused NAND gates in upstream HLEs. If so, this may allow the number of HLEs in the CHLE to be even further reduced. This is so-called NAND MUX packing.

In the illustrative embodiment being discussed, a CHLE is not allowed to include more than six HLEs. Accordingly, step 524 is performed on the results from step 522 to determine whether step 522 indicates that the LUT under consideration can be implemented using six or fewer HLEs. If so, control passes from step 524 to step 526. If not, control passes from step 524 to step 530. The branch from step 524 to step 526 will be considered first.

In step 526 a so-called "CHLE signature" for the CHLE developed in step 522 is computed. At this point it may be helpful to look at FIG. 5.

Figure 5:
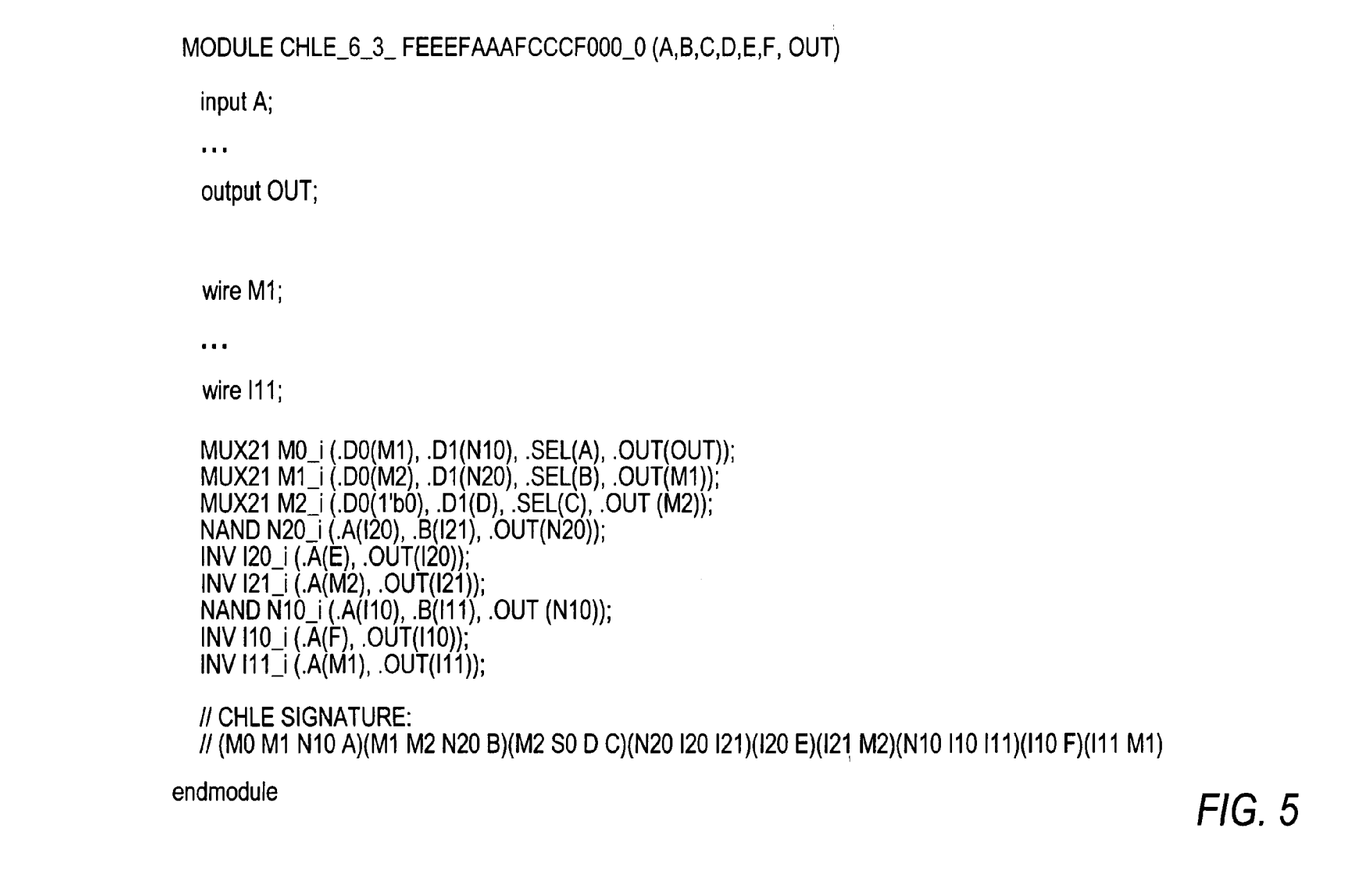
FIG. 5 is a simplified, partial listing of an illustrative specification or design for structured ASIC logic that is useful in explaining various aspects of the invention.

FIG. 5 shows representative portions of a specification for an illustrative CHLE in accordance with the invention. This specification can be in standard Verilog or any other generally comparable representation. The first line in FIG. 5 ("module chle_6_3 . . . ") includes (in order, from left to right) the following information about the illustrative LUT implemented by the CHLE: the number of inputs ("6"); the number of HLEs in the CHLE ("3"); the lutmask value ("FEEEFAAAFCCCF000," which are 16 hexidecimal digits representing the 64 bits stored in the look-up table of the LUT); the version number associated with the following implementation of a LUT having this lutmask value ("0"); and reference names of the inputs to and output from the CHLE ("(A, B, C, D, E, F, OUT)"). It should be noted that the lutmask value mentioned in the preceding sentence is one of the components of the library cell key mentioned earlier in this specification. The other component of the library cell key is the number of inputs to the LUT (6 in the illustrative example shown in FIG. 5).

The next few lines in FIG. 5 are standard Verilog statements identifying inputs (e.g., "input A"), outputs ("output OUT"), and internal connectivity (e.g., "wire M1" and "wire I11") of the CHLE. Again, the use of standard Verilog is only illustrative.

After the above-described lines, the next several lines in FIG. 5 specify each of the devices in the CHLE. There is one line for each such device. Once again, standard Verilog is shown for purposes of illustration. For example, the first of these lines ("MUX21 M0_i . . . ") is for a 2-to-1 multiplexer that is given the name M0. Its first selectable input ("D0") comes from wire M1, and its second selectable input ("D1") comes from the output of the NAND gate called N10. Its selection control ("SEL") input comes from input A. And its output ("OUT") is the OUT signal of the CHLE. The following convention is followed in assigning names: M means MUX (multiplexer), N means NAND gate, I means INV (inverter), S0 means ground, S1 means VCC, and A through F indicate the inputs. The first number (if any) following these characters indicates which HLE it belongs to. The second number (if any) following that indicates the instance of the specified type of device in the HLE.

Following the above-described specification lines are two comment lines ("//CHLE SIGNATURE:" and "//(M0 M1 . . . )"). The contents of the second of these lines is the "CHLE signature" of the CHLE specified by the preceding lines. It will be noted that the CHLE signature is just a condensed representation of the lines above. For example, the "(M0 M1 N10 A)" portion of the CHLE signature comes from the "MUX21 M0_i . . . " line above. Similarly, the "(M1 M2 N20 B)" portion of the CHLE signature comes form the "MUX21 M1_i . . . " line above. (Note that the naming convention described above continues to be followed in the CHLE signature.) The CHLE signature is thus a complete, although abbreviated or condensed, representation of the CHLE. This representation is what is meant by "CHLE signature" in step 526 in FIG. 4b, and FIG. 5 shows how the CHLE signature (needed in step 526) is determined.

Figure 4B:
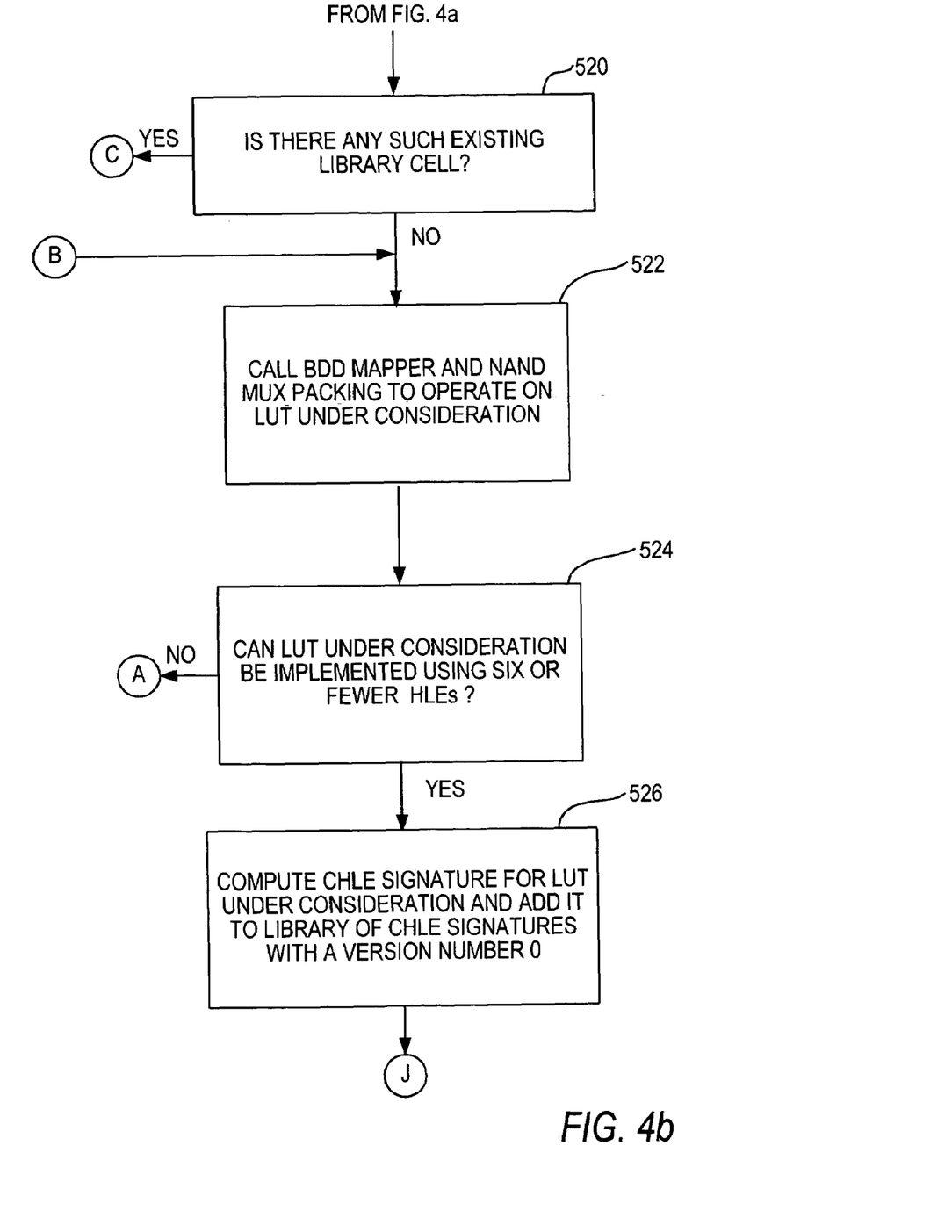
Figure 4C:
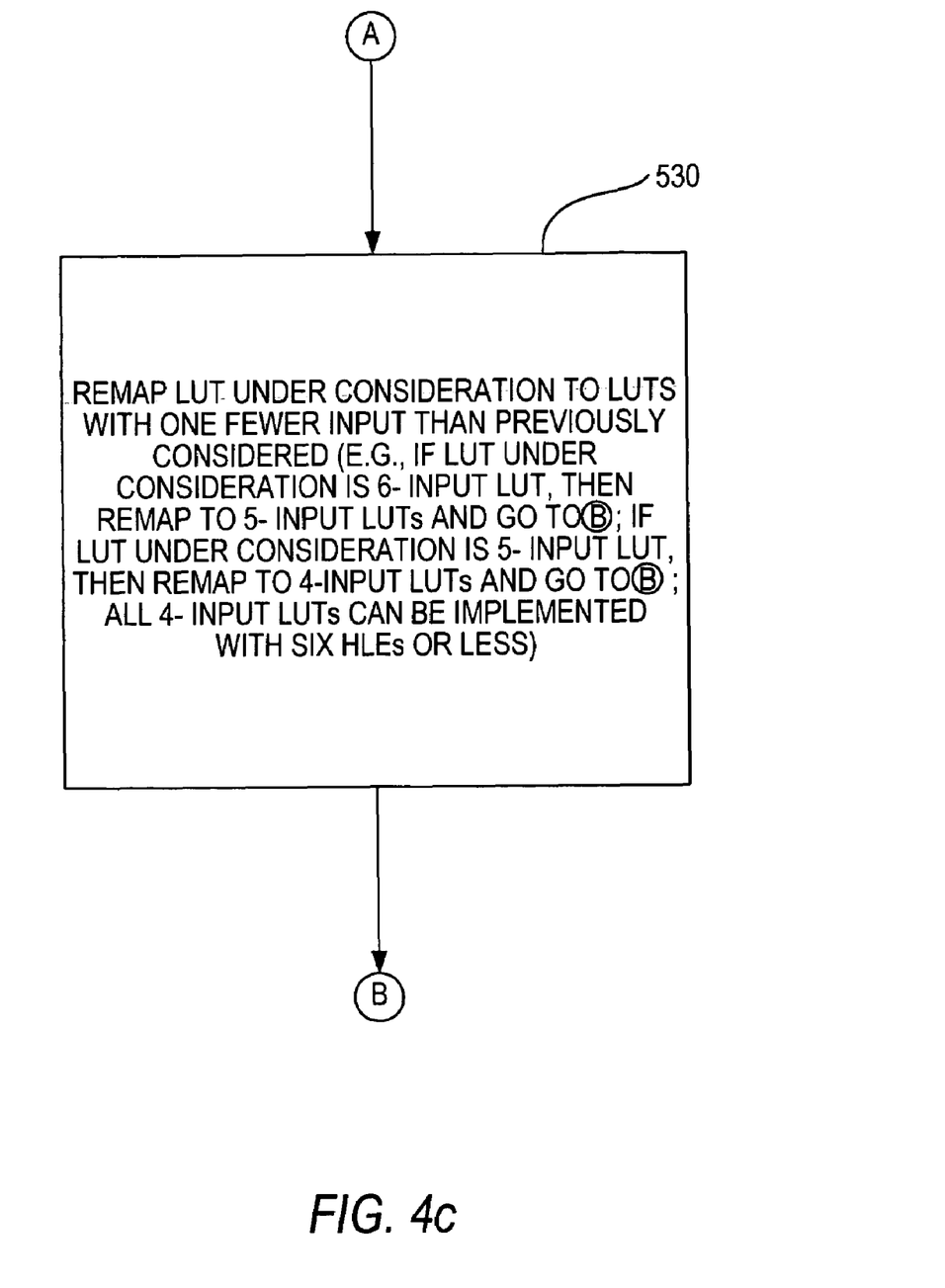
Figure 4D:
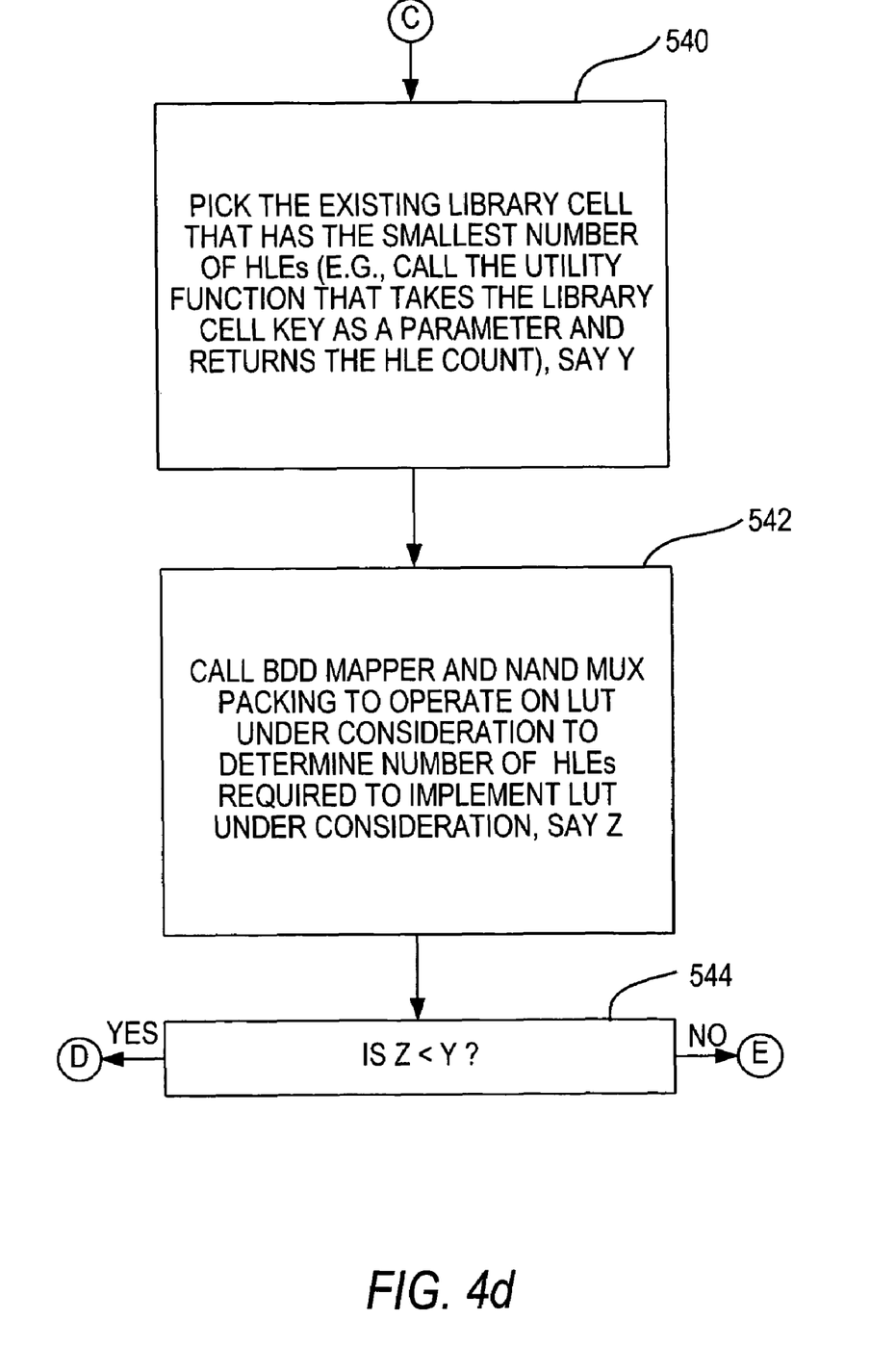
Figure 4E:
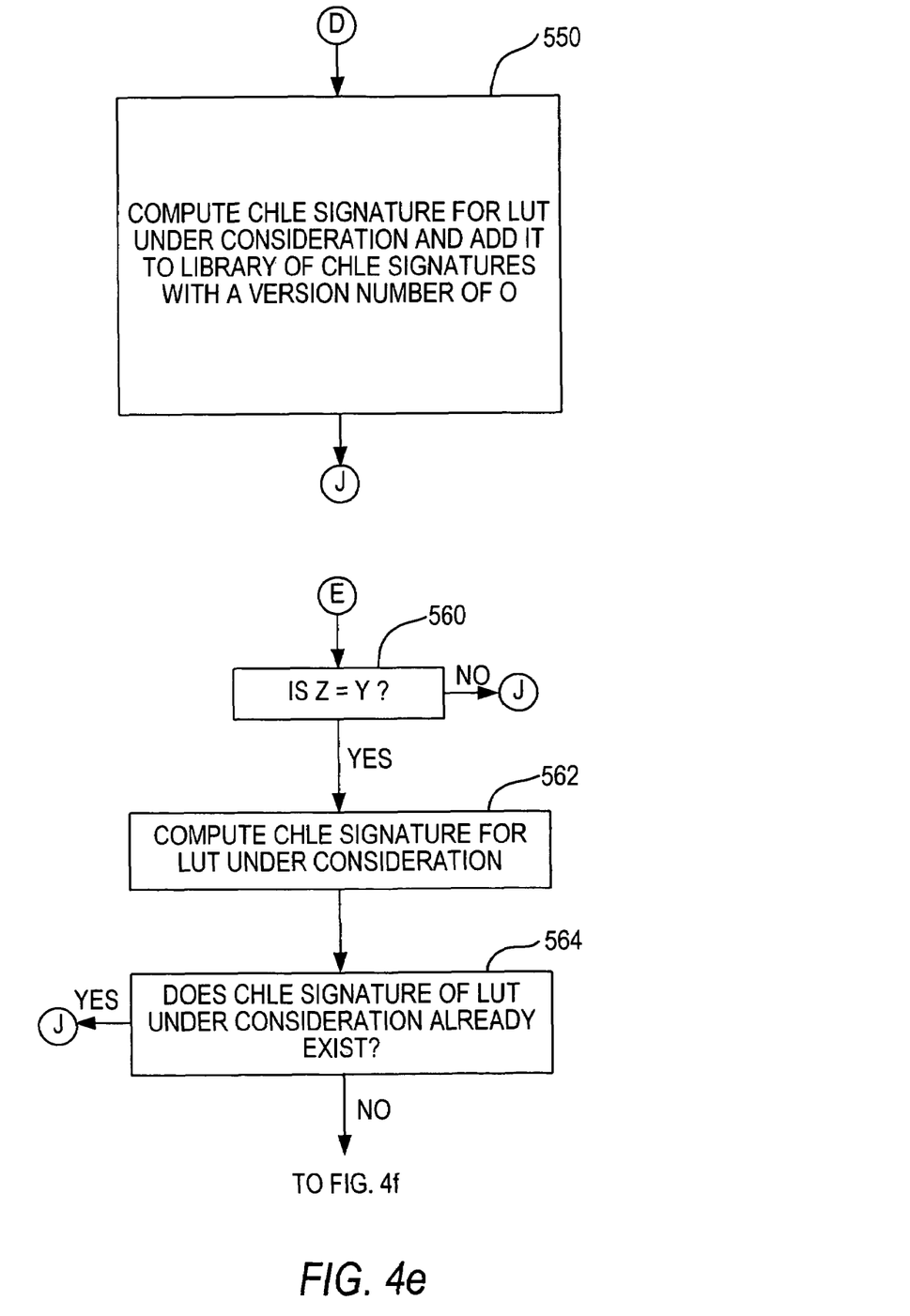
Figure 4F:
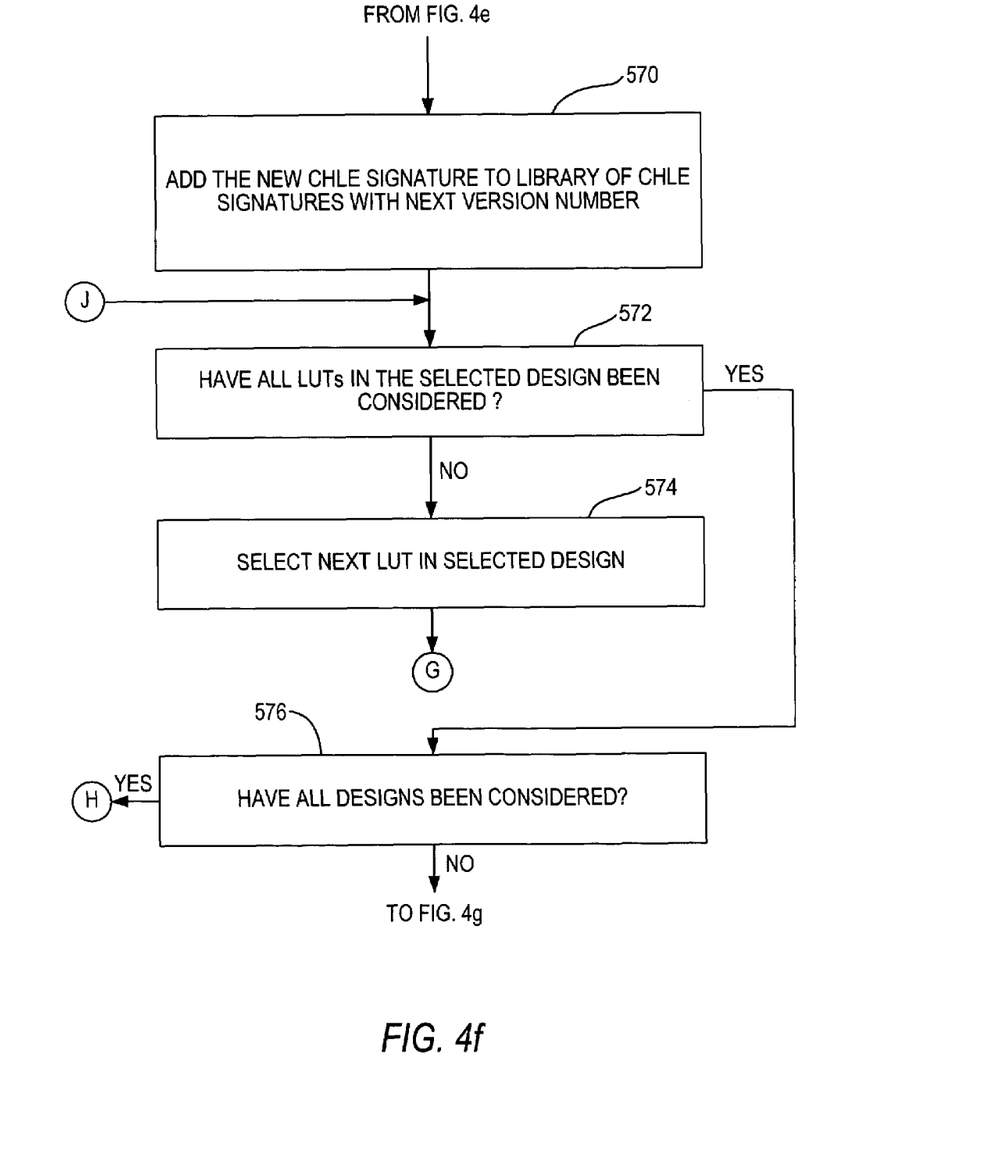
Figure 4G:
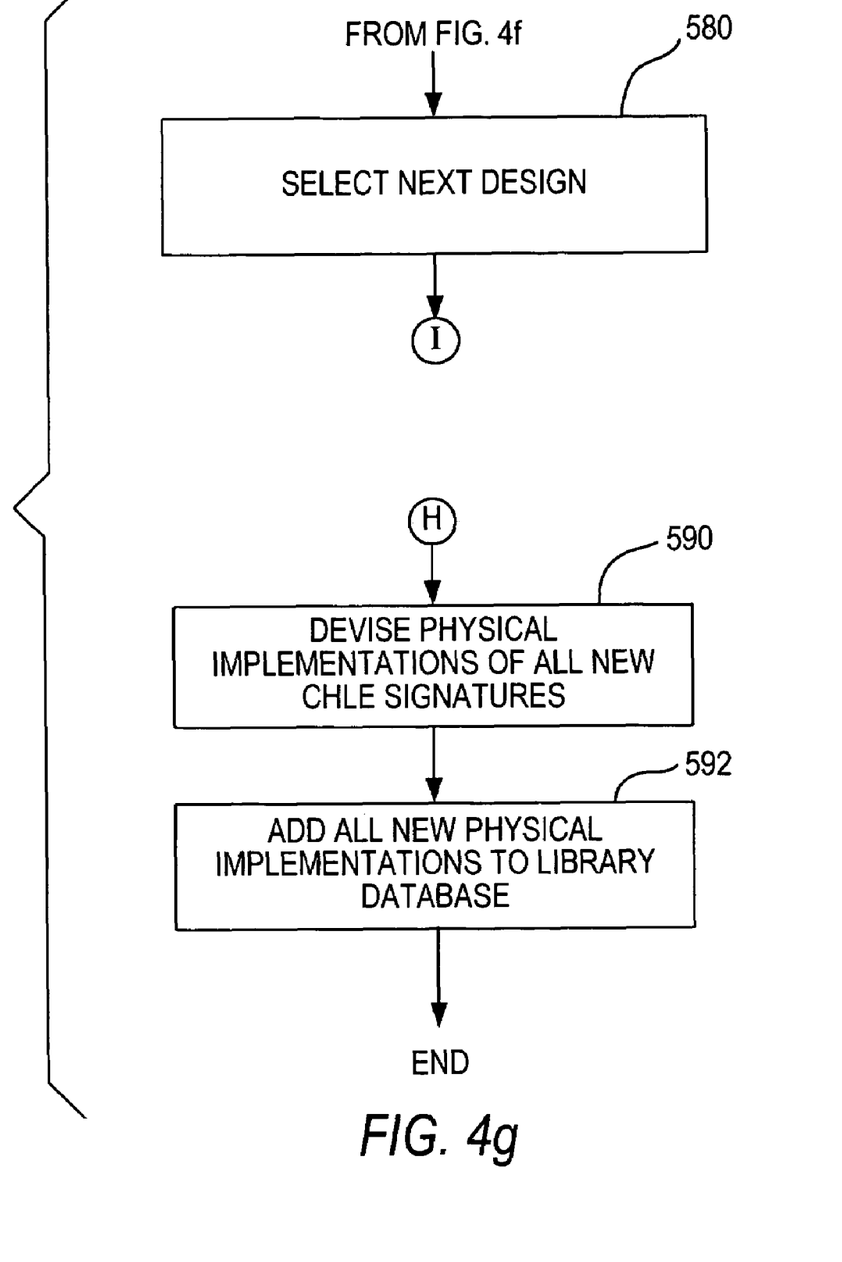

Returning to step 526 in FIG. 4b, the CHLE signature determined as described above is added to a library of previously known CHLE signatures and given a version number of 0. Control then passes to step 572.

In step 572 it is determined whether or not all LUTs in the FPGA design under consideration have been dealt with. If not, step 574 is performed to select another LUT in the current design for consideration. Control then passes back to step 512 where consideration of the next LUT begins as described above.

If in step 572 it is found that all LUTs have been considered, then control passes from step 572 to step 576 where it is determined whether or not all of the FPGA designs to be considered have been dealt with. If not, control passes from step 576 to step 580 where another FPGA design is selected for consideration. From step 580 control passes back to step 512 where consideration of the LUTs in the next FPGA design begins.

If in step 576 it is determined that all of the FPGA designs to be considered have been processed, then control passes from step 576 to step 590.

In step 590 a physical implementation is devised for each of the new CHLE signatures developed during the performance of the preceding steps. This means selecting the actual connections that will be made to route signals within and between the HLEs in the CHLE. For example, this may include selecting what conductors and what vias will be used for these connections. Physical device selection may also be made at this point (e.g., which of the NAND gates in an HLE will be used to perform a particular NAND function of the HLE, and similarly for the inverters in an HLE). This step may be wholly or partly automated, or it may be wholly or partly "manual" (performed by a human circuit designer). This step may include the freedom to utilize unused inverters and/or NAND gates in the HLEs to build a maximum driving strength CHLE (see, for example, FIGS. 21-23 and related text in the abovementioned Chua et al. reference). However, this step is preferably not allowed to move or get rid of any inverters or NAND gates specified in the module definition. In particular, the HLE boundaries within the CHLE are preferably maintained.

After step 590 has been performed for all new CHLE signatures, step 592 is performed to add the new physical implementations to the library of available physical implementations. The process is now complete.

There are several branches and steps in FIG. 4 that have not yet been described. Returning to step 520, the branch from that step to step 540 has not yet been considered. This branch is employed when step 514 finds one or more existing library cell instances that have library cell key equal to X. When that happens, step 540 is performed to find among the existing library cell instances that have library cell key X the instance having the smallest number of HLEs. In step 540 this number of HLEs is assumed to be Y.

Step 542 is then performed to operate on the LUT under consideration in substantially the same way as in above-described step 522. A result of performing step 542 is determining a number of HLEs currently required to implement the LUT under consideration. In step 542 this number is assumed to be Z. (Note that the process cannot get into this branch if Z is going to be greater than 6, because in the illustrative embodiment being described a CHLE is not allowed to include more than six HLEs. Step 514 will therefore never find any existing library cell instances for LUTs that require more than six HLEs to implement.)

Step 544 compares Z to Y. If Z is less than Y, then the performance of step 542 has produced a CHLE that is more efficient in terms of HLE consumption than was previously known for library cell key value X. (Such improvement can occur, for example, as a result of the development of better algorithms or techniques for finding CHLE equivalents of LUT-based logic functions.) Control consequently passes from step 544 to step 550 (previously described), which continues the process of adding that more-efficient CHLE to the library of known CHLEs available for future use.

Returning to step 544, if Z is not less than Y, control passes from step 544 to step 560, which tests for equality between Z and Y. If they are equal, control passes from step 560 to step 562.

In step 562 the CHLE signature of the LUT under consideration is determined (e.g., as described above in connection with FIG. 5). Step 564 then tests whether that CHLE signature already exists in the library of such signatures. If so, nothing further needs to be done for that LUT, and control passes from step 564 to previously described step 572. On the other hand, if step 564 finds that the CHLE signature determined in step 562 is new, control passes from step 564 to step 570. This means that a new CHLE equivalent to a LUT with a library cell key for at which at least one other CHLE equivalent was already known has been found. Accordingly, step 570 is performed to add the new CHLE signature to the library of known CHLE signatures, but the next higher version number is associated with that CHLE signature in the library to distinguish the new solution from all previously known solutions. From step 570 control passes to previously described step 572.

The only branch of the process that has not yet been described is the branch from step 524 to step 530. This branch is followed when step 524 finds that the LUT under consideration cannot be implemented with six or fewer HLEs. As has been mentioned, this six-HLE limit is a characteristic of the illustrative embodiment being described, but this limit can be more or less than six HLEs in other embodiments.

If the LUT under consideration cannot be implemented using six or fewer HLEs, then step 530 is performed to remap the LUT under consideration to two or more smaller LUTs that are collectively equivalent to the starting LUT. For example, if the starting LUT is a six-input LUT, it is remapped to five-input LUTs. Control then returns to step 522 where each of these five-input LUTs becomes in turn the LUT under consideration for processing as previously described. If the starting LUT that causes step 530 to be entered is a five-input LUT, then step 530 remaps that LUT to four-input LUTs and control returns to step 522 where each of these four-input LUTs is treated in turn as the LUT under consideration. As noted in step 530, all four-input LUTs can be implemented using six or fewer HLEs. Step 530 will therefore never be reached when the LUT under consideration has four or fewer inputs.

The foregoing describes the process by which a library of known CHLE equivalents to LUT-based logic functions can be built and progressively enlarged. Such a library is useful in producing structured ASIC equivalents to FPGA logic designs. The inclusion of version information in the library database allows a user to control what level of functions in the library will be used in a particular FPGA-to-structured-ASIC conversion. For example, a user may elect to use the most advanced (highest version number) of all functions for which multiple solutions exist in the library. Or a user may elect not to progress beyond a particular "legacy" version for certain functions.

Another aspect of the invention relates to providing machine-readable media (e.g., CD-ROM, magnetic tape, or the like) encoded with machine-readable instructions for performing any of the various methods of the invention as shown and described herein.

It will be understood that the foregoing is only illustrative of the principles of the invention, and that various modifications can be made by those skilled in the art without departing from the scope and spirit of the invention. For example, the above-described six-HLE limit on the maximum size of CHLEs is only illustrative, and a greater or lesser size limit can be used instead if desired. As another example, the particular configuration of HLEs shown herein is only illustrative, and any other HLE configuration can be used instead if desired. As still another example, the particular order of some of the steps in the illustrative embodiment shown herein can be changed if desired.

The invention claimed is:

1. A method of expanding a library of known structured ASIC equivalents of FPGA logic functions, which library can be reused in designing multiple different structured ASIC products that are respectively equivalent to multiple differently programmed FPGAs, each of the known structured ASIC equivalents that are already in the library having an associated characteristic value that is a characteristic of the FPGA logic function for which it is an equivalent, the associated characteristic values being stored in the library with the known structured ASIC equivalents, the method comprising:
   computing the characteristic value for a logic function in an FPGA logic design;
   using the characteristic value to determine whether the library already contains any known structured ASIC equivalents of the logic function by comparing the characteristic value from the computing to the characteristic values that are stored in the library;
   determining a structured ASIC equivalent of the logic function; and
   adding the structured equivalent from the determining to the library if the using did not find any known structured ASIC equivalents of the logic function already in the library or if the structured ASIC equivalent from the determining is different from and no less efficient than any known structured ASIC equivalent of the logic function that is already in the library.

2. The method defined in claim 1 wherein the adding comprises associating a version reference with any structured ASIC equivalent that is added to the library.

3. The method defined in claim 1 wherein the computing comprises:
   placing the logic function in a canonical form; and
   including information based on the canonical form of the logic function in the characteristic value.

4. The method defined in claim 3 wherein the characteristic value further includes information about the number of inputs to the logic function.

5. The method defined in claim 1 wherein the determining comprises:
   computing a signature value that is characteristic of the structured ASIC equivalent.

6. The method defined in claim 5 wherein the adding comprises:
   comparing the signature value from the computing to a signature value of any structured ASIC equivalent of the logic function that is already in the library.

7. The method defined in claim 6 wherein the adding further comprises:
   discarding any structured ASIC equivalent having a signature value that is the same as the signature value of any structured ASIC equivalent of the logic function that is already in the library.

8. The method defined in claim 7 wherein the adding still further comprises:
   discarding any structured ASIC equivalent having a signature value that requires more ASIC logic to implement than a structured ASIC equivalent of the logic function that is already in the library.

9. The method defined in claim 1 wherein a structured ASIC equivalent of a logic function is permitted to include only a predetermined maximum amount of ASIC circuitry, and wherein the determining comprises:
   ensuring that the structured ASIC equivalent does not require more than the predetermined maximum amount of ASIC circuitry.

10. The method defined in claim 9 wherein the ensuring comprises:
    subdividing any logic function for which the structured ASIC equivalent requires more than the predetermined maximum amount of ASIC circuitry; and
    processing as a separate logic function each subdivision of a logic function from the subdividing.

11. Machine-readable media encoded with machine-readable instructions for performing the method defined in claim 1.

12. A method of adding to a library of structured ASIC equivalents of LUT-implementable logic functions, each structured ASIC equivalent including one or more instances of an ASIC circuit module, the method comprising:
    selecting a logic function for consideration;
    comparing a characteristic of the logic function under consideration to a similar characteristic of logic functions that are already in the library;
    designing a structured ASIC equivalent of the logic function under consideration;
    abstracting the structured ASIC equivalent from the designing using a signature value;
    adding the structured ASIC equivalent from the designing and the signature value to the library if the comparing finds no logic function with a comparable characteristic already in the library; and
    if the comparing finds one or more instances of the logic function with comparable characteristic already in the library, then adding the structured ASIC equivalent from the designing and the signature value to the library only if the signature value indicates that the structured ASIC equivalent is different from the structured ASIC equivalents that are already in the library for instances of the logic function found in the comparing.

13. The method defined in claim 12 wherein, if the comparing finds one or more instances of the logic function with comparable characteristic already in the library, then the consequent adding is performed only if the structured ASIC equivalent from the designing uses no more instances of the ASIC circuit module than any other instances of the logic function found in the comparing.

14. Machine-readable media encoded with machine-readable instructions for performing the method defined in claim 12.

* * * * *